(12) United States Patent
Yamano et al.

(10) Patent No.: US 8,102,048 B2
(45) Date of Patent: Jan. 24, 2012

(54) ELECTRONIC DEVICE MANUFACTURING METHOD AND ELECTRONIC DEVICE

(75) Inventors: Takaharu Yamano, Nagano (JP); Tadashi Arai, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 753 days.

(21) Appl. No.: 12/140,651

(22) Filed: Jun. 17, 2008

(65) Prior Publication Data

US 2008/0315413 A1    Dec. 25, 2008

(30) Foreign Application Priority Data

Jun. 18, 2007 (JP) ................................ 2007-160614

(51) Int. Cl.
*H01L 23/48* (2006.01)

(52) U.S. Cl. ............... 257/738; 257/737; 257/E23.021; 438/618

(58) Field of Classification Search .................. 257/738, 257/E23.021, E23.023, 737; 438/129, 613
See application file for complete search history.

(56) References Cited

U.S. PATENT DOCUMENTS

| | | | |
|---|---|---|---|
| 6,157,080 A * | 12/2000 | Tamaki et al. | 257/738 |
| 6,492,200 B1 | 12/2002 | Park et al. | |
| 2002/0164840 A1 * | 11/2002 | Lu et al. | 438/129 |
| 2004/0115868 A1 | 6/2004 | Ono | |
| 2004/0171193 A1 | 9/2004 | Hayashida | |
| 2006/0177964 A1 | 8/2006 | Hedler et al. | |

FOREIGN PATENT DOCUMENTS

| | | |
|---|---|---|
| EP | 1 030 357 A1 | 8/2000 |
| JP | 9-64049 | 3/1997 |
| JP | 2000-58695 | 2/2000 |
| JP | 2001-118876 | 4/2001 |
| JP | 2002-313985 | 10/2002 |
| JP | 2004-6486 | 1/2004 |
| JP | 2004-363250 | 12/2004 |
| JP | 2005-158929 | 6/2005 |
| WO | WO 00/77844 A1 | 12/2000 |

OTHER PUBLICATIONS

M. Ashby, "Materials Selection in Mechanical Design Third Edition", Elsevier Butterworth Heinemann; ISBN: 0 7506 6168 2, p. 51.
"Material Properties of Polyimide", Internet Article [Online], XP002526522, May 5, 2009, pp. 1-2.

* cited by examiner

*Primary Examiner* — Matthew E Warren
*Assistant Examiner* — Fang-Xing Jiang
(74) *Attorney, Agent, or Firm* — Drinker Biddle & Reath LLP (57) ABSTRACT

There are provided the steps of forming a bump 104 on an electrode pad 103 provided on a semiconductor chip 101, forming a low-modulus insulating layer 120 on the semiconductor chip 101 and laminating, on the low-modulus insulating layer 120, a high-modulus insulating layer 121 having a higher elastic modulus than an elastic modulus of the low-modulus insulating layer 120, thereby forming a laminated insulating layer 105, exposing a part of the bump 104 from an upper surface of the laminated insulating layer 105, and forming a conductive pattern 106 connected to the bump 104.

3 Claims, 8 Drawing Sheets

ELECTRONIC DEVICE MANUFACTURING METHOD AND ELECTRONIC DEVICE

BACKGROUND OF THE INVENTION

The present invention relates to a method of manufacturing an electronic device and the electronic device, and more particularly, to a method of manufacturing an electronic device having a structure in which a substrate body and a conductive pattern formed thereon through an insulating layer are connected to each other by using a bump, and the electronic device.

For example, there has variously been provided an electronic apparatus in which an electrode and a conductive pattern are formed on a substrate such as a semiconductor substrate or a glass substrate. As one of types, a semiconductor device referred to as a chip size package has been provided (for example, see Patent Document 1).

The chip size package has a structure in which a rewiring is formed through an insulating layer (a protecting layer) on a surface of a semiconductor chip obtained by dicing a wafer to be a semiconductor substrate on which a device is formed.

In order to manufacture a chip size package disclosed in Patent Document 1, moreover, a plurality of electrodes is first formed on a semiconductor chip region of a semiconductor wafer and a bump is formed on each of the electrodes. The bump is formed through a bonding wire by using a bonding device.

Subsequently, the semiconductor wafer having the bump formed thereon is covered with a resin to be an insulating layer, and furthermore, an upper surface of the bump is exposed from the insulating layer. A conductive pattern (which is also referred to as a rewiring) is formed to be electrically connected to each bump exposed to an upper part of the insulating layer, and furthermore, a solder resist is formed thereon.

Next, a solder ball is formed on the conductive pattern through an opening formed on the solder resist. When the step is ended, a division processing (a dicing processing) is individually carried out over the semiconductor wafer every semiconductor chip region. Consequently, a chip size package is manufactured.

[Patent Document 1]
 JP-A-2002-313985

In the chip size package, a periphery of a bonding position of the bump and the conductive pattern is covered with the insulating layer. Moreover, the insulating layer has conventionally had a single layer structure formed by a single material.

For the material of the insulating layer, a high-modulus resin material capable of enhancing an electrical bonding property of the bump and the conductive pattern is generally selected. In the case in which the high-modulus resin material is used for the insulating layer, a reliability of an electrical connection can be enhanced because the bump and the conductive pattern are covered and hardened and are thus protected by a hard resin.

However, the high-modulus resin material generally contracts greatly after heat curing in a formation, causing a problem in that a warpage is generated on a wafer or a chip size package obtained after a division.

On the other hand, as a method of solving the problem of the warpage, it is possible to propose the use of a low-modulus resin as an insulating layer. In general, the low-modulus resin has a smaller contraction after the heat curing than the high-modulus resin material. Therefore, it is possible to suppress the generation of the warpage on the wafer or the chip size package obtained after the division.

When the low-modulus resin is used as the insulating layer, however, a stress is generated between the bump and the conductive pattern. In the worst case, the bump is peeled from the conductive pattern. As a result, there is a problem in that a reliability of an electrical connection is deteriorated greatly.

SUMMARY OF THE INVENTION

In consideration of the respects, it is an object of the invention to provide a method of manufacturing an electronic device and the electronic device which can suppress the generation of a warpage and can enhance a reliability of an electrical connection.

In order to solve the problems, according to a first aspect of the invention, there is provided a method of manufacturing an electronic device including:

a first step of forming a bump on an electrode pad provided on a substrate body;

a second step of forming a first insulating layer on the substrate body, and laminating and forming a second insulating layer having a higher elastic modulus than an elastic modulus of the first insulating layer on the first insulating layer;

a third step of exposing a part of the bump to an upper surface of the insulating layer; and a fourth step of forming a conductive pattern connected to the bump.

Further, according to a second aspect of the invention, there is provided the method of manufacturing an electronic device according to the first aspect, wherein the first insulating layer has an elastic modulus which is equal to or higher than 20 MPa and is lower than 1,000 MPa, and the second insulating layer has an elastic modulus which is equal to or higher than 1,000 MPa.

Further, according to a third aspect of the invention, there is provided the method of manufacturing an electronic device according to the first or second aspect, wherein the first and second insulating layers are formed by non-conductive resins.

Further, according to a forth aspect of the invention, there is provided the method of manufacturing an electronic device according to any one of the first to third aspects, wherein the fourth step has the steps of:

forming a conductive layer on the upper surface of the insulating layer and an exposed portion of the bump;

forming a wiring layer through electrolytic plating using the conductive layer as a feeding layer; and patterning the wiring layer to form a conductive pattern connected to the bump.

Further, according to a fifth aspect of the invention, there is provided the method of manufacturing an electronic device according to any one of the first to third aspects, wherein the substrate is a semiconductor substrate.

Further, according to a sixth aspect of the invention, there is provided the method of manufacturing an electronic device according to any one of the first to fifth aspects, wherein the bump is formed through a bonding wire at the first step.

Further, according to a seventh aspect of the invention, there is provided an electronic device including:

a substrate body having an electrode pad formed thereon;

a bump formed on the electrode pad;

a laminated insulating layer constituted by a first insulating layer formed on the substrate body and a second insulating layer having a higher elastic modulus than an elastic modulus of the first insulating layer and laminated and formed on the first insulating layer; and a conductive pattern formed on the laminated insulating layer and connected to the bump.

Further, according to an eighth aspect, there is provided the electronic device according to the seventh aspect, wherein the first insulating layer has an elastic modulus which is equal to or higher than 20 MPa and is lower than 1,000 MPa, and the second insulating layer has an elastic modulus which is equal to or higher than 1,000 MPa.

Further, according to a ninth aspect, there is provided the electronic device according to the seventh or eighth aspect, wherein the substrate body is a semiconductor chip.

According to the invention, the second insulating layer having a higher elastic modulus than the elastic modulus of the first insulating layer is present around the connecting position of the bump and the conductive pattern. Even if a stress acts in the connecting position of the bump and the conductive pattern, therefore, it is absorbed, fixed and protected by the second insulating layer having the high elastic modulus. Accordingly, it is possible to enhance an electrical connecting reliability of the bump and the conductive pattern.

Moreover, the first insulating layer having a lower elastic modulus than the elastic modulus of the second insulating layer is present in the position in which the laminated insulating layer is connected to the substrate body. Therefore, a cure shrinkage of the whole laminated insulating layer can be set to be lower than that in the case in which the whole laminated insulating layer is formed by a single layer having a high elastic modulus. Accordingly, it is possible to reduce a warpage generated in the electronic device.

DETAILED DESCRIPTION OF THE PREFERRED EMBODIMENTS

Next, the best mode for carrying out the invention will be described with reference to the drawings.

Figure 1A:
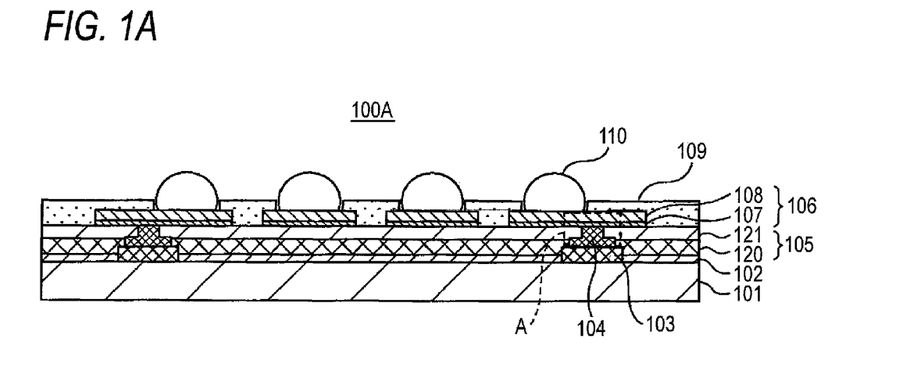
FIG. 1A is a sectional view showing a semiconductor device according to a first example of the invention.

FIG. 1A shows an electronic device according to a first example of the invention. In the example, description will be given by taking, as an example of the electronic device, a semiconductor device 100A (CSP) set to have a chip size.

The semiconductor device 100A according to the example has a structure in which a laminated insulating layer 105 (which will be described below) and a conductive pattern 106 are laminated and formed on a protecting layer (a passivation layer) 102 of a semiconductor chip 101 on which an electrode pad 103 is formed. Moreover, a bump 104 constituted by Au is formed on the electrode bump 103, for example. The bump 104 is formed through a bonding wire by using a wire bonding device, for example.

The conductive pattern 106 is referred to as a rewiring in some cases and is provided to cause a position of the electrode pad 103 of the semiconductor chip 101 to be different from that of a solder bump 110 serving as an external connecting terminal (in order to carry out fan in and a terminal arrangement in an optional position). Moreover, the laminated insulating layer 105 is constituted by an epoxy based resin, for example, and serves to protect a surface (a main surface) of the semiconductor chip 101 on which a circuit is formed and serves as a base material in the formation of the conductive pattern 106.

Figure 1B:
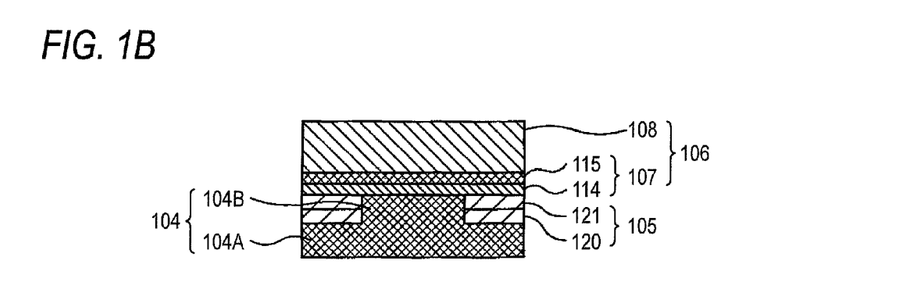
FIG. 1B is a sectional view showing the enlarged vicinity of a bump in FIG. 1A.

The conductive pattern 106 has a structure in which a first conductive pattern 107 and a second conductive pattern 108 are laminated, and furthermore, the first conductive pattern 107 has a structure in which a titanium film 114 and a copper film 115 are laminated as shown in an enlarged view of FIG. 1B. The first conductive pattern 107 (the titanium film 114, the copper film 115) is formed by a sputtering process (a PVD process). FIG. 1B is an enlarged view showing a region (the vicinity of the bump 104) of the semiconductor device 100A which is surrounded by a broken line indicated as A in FIG. 1.

As described above, the first conductive pattern 107 is connected to the bump 104 so that the conductive pattern 106 is connected to an electronic circuit of the semiconductor chip 101 through the bump 104. A solder resist layer (an insulating layer) 109 is formed to cover the laminated insulating layer 105 and a part of the conductive pattern 106 around the solder bump 110.

On the other hand, the bump 104 is constituted by a bump body 104A to be bonded to the electrode pad 103 and a protruded portion 104B which is protruded from the bump body 104A as shown in FIG. 1B. The bump 104 is formed by a bonding wire constituted by Au, for example, through a wire bonding device.

The wire bonding device continuously bonds the bonding wire to the electrode pad 103 and cuts the bonding wire after the bonding, thereby forming the bump body 104A to be bonded to the bump 103 and the protruded portion 104B which is protruded from the bump body 104A.

The laminated insulating layer 105 will be noted. In the example, the laminated insulating layer 105 has a structure in which a low-modulus insulating layer 120 (a first insulating layer) and a high-modulus insulating layer 121 (a second insulating layer) are laminated. The low-modulus insulating layer 120 is formed on the semiconductor chip 101 side and the high-modulus insulating layer 121 is formed on the conductive pattern 106 side.

Both the low-modulus insulating layer 120 and the high-modulus insulating layer 121 are constituted by resin materials (non-conductive films) to which a hardness regulating material such as a filler referred to as NCF is rarely added. However, there are selected the low-modulus insulating layer 120 having an elastic modulus which is equal to or higher than 20 MPa and is lower than 1,000 MPa and the high-modulus insulating layer 121 having an elastic modulus which is equal to or higher than 1,000 MPa.

Moreover, the materials of the low-modulus insulating layer 120 and the high-modulus insulating layer 121 are not restricted to the NCF but it is also possible to use a buildup resin (an epoxy resin containing a filler) and a resin material referred to as ACF if they can implement the characteristics.

According to the semiconductor device 100A having the structure, the high-modulus insulating layer 121 having a higher elastic modulus than the low-modulus insulating layer 120 is present around the connecting position of the bump 104 (the protruded portion 104B) and the conductive pattern 106 (the first conductive pattern 107).

Even if a stress acts on the connecting position of the bump 104 and the conductive pattern 106, therefore, it is firmly fixed by covering the connecting position with the high-modulus insulating layer 121 having a high elastic modulus. Accordingly, the bump 104 is prevented from being peeled from the conductive pattern 106. Thus, it is possible to enhance the electrical connecting reliability of the bump 104 and the conductive pattern 106.

On the other hand, the low-modulus insulating layer 120 having a lower elastic modulus than the high-modulus insulating layer 121 is present in a position in which the laminated insulating layer 105 is connected to the semiconductor chip 101 (including the protecting layer 102). Accordingly, interfacial peeling from the protecting layer 102 can be prevented. Therefore, a cure shrinkage of the whole laminated insulating layer 105 can be set to be lower than that in the case in which all of the insulating layers are formed by the high-modulus material as in the conventional art. As compared with the case in which all of the insulating layers are formed by the high-modulus material, consequently, it is possible to reduce a warpage generated in the semiconductor device 100A.

According to the semiconductor device 100A in accordance with the example, thus, it is possible to prevent the warpage from being generated in the semiconductor device 100A while enhancing an electrical connecting reliability of the bump 104 and the conductive pattern 106.

Figure 2:
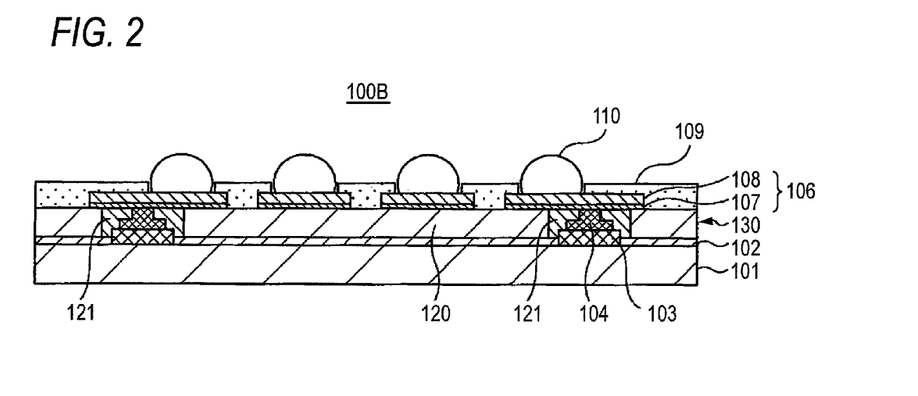
FIG. 2 is a sectional view showing the semiconductor device according to the first example of the invention.

FIG. 2 shows a semiconductor device 100B according to a second example of the invention. In FIG. 2, corresponding structures to those shown in FIG. 1 have the same reference numerals and description thereof will be omitted.

The semiconductor device 100A according to the first example has the structure in which the laminated insulating layer 105 has the low-modulus insulating layer 120 and the high-modulus insulating layer 121 laminated thereon. On the other hand, the semiconductor device 100B according to the example is characterized in that a division insulating layer 130 is provided in place of the laminated insulating layer 105.

The division insulating layer 130 has a structure in which the high-modulus insulating layer 121 is formed in only a vicinal position of a bump 104 and the low-modulus insulating layer 120 is formed in the other portions. The high-modulus insulating layer 121 is formed cylindrically to surround the bump 104. Moreover, the low-modulus insulating layer 120 and the high-modulus insulating layer 121 are not laminated as in the first example but are formed wholly in a vertical direction from a semiconductor chip 101 to a conductive pattern 106. Each of the low-modulus insulating layer 120 and the high-modulus insulating layer 121 has an elastic modulus which is set to be equal to that in the first example.

With the structure according to the example, similarly, the high-modulus insulating layer 121 is present around a bonding position of the bump 104 and the conductive pattern 106, and the semiconductor chip 101 and the division insulating layer 130 are mostly bonded to each other through the low-modulus insulating layer 120. Even if a stress acts in the connecting position of the bump 104 and the conductive pattern 106, therefore, it is firmly fixed by covering the connecting position with the high-modulus insulating layer 121 having a high elastic modulus, and furthermore, it is possible to reduce a warpage generated in the semiconductor device 100A through the low-modulus insulating layer 120. By the semiconductor device 100B, accordingly, it is possible to prevent the warpage from being generated in the semiconductor device 100B while enhancing an electrical connecting reliability of the bump 104 and the conductive pattern 106.

Next, a method of manufacturing the semiconductor device 100A according to the first example will be described with reference to FIGS. 3A to 3M. In FIGS. 3A to 3M, corresponding structures to those shown in FIGS. 1 and 2 have the same reference numerals and description thereof will be omitted.

In order to manufacture the semiconductor device 100A, first of all, a semiconductor substrate 101A (a wafer which will be hereinafter referred to as a substrate 101A) having a plurality of regions 101a (like a grid, for example) in which an electronic circuit is formed is manufactured by using a well-known method at a step shown in FIG. 3A.

The region 101a corresponds to the semiconductor chip 101. An electrode pad 103 is formed on a device forming surface 101b of the region 101a on which an electronic circuit is formed. Moreover, a protecting layer (a passivation layer) 102 formed of SiN ($Si_3N_4$) is provided in a portion other than the electrode pad 103 in the device forming surface 101b. Consequently, the device forming surface 101b is protected.

Figure 3A:
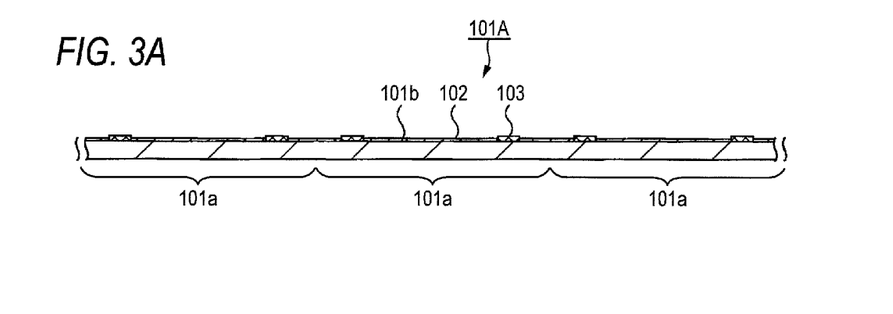
FIG. 3A is a sectional view (No. 1) for explaining a method of manufacturing a semiconductor device according to the first example of the invention.
Figure 3B:
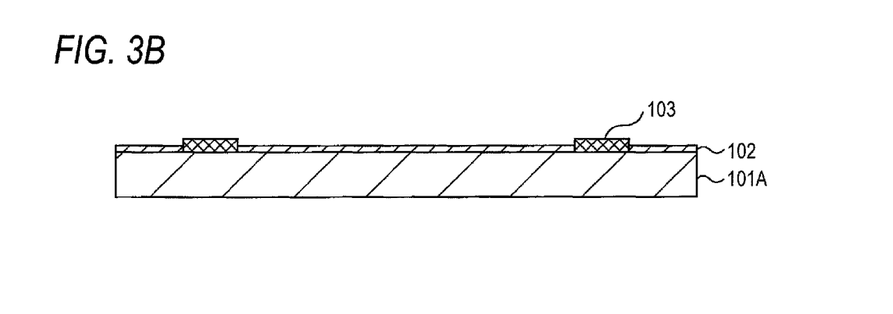
FIG. 3B is a sectional view (No. 2) for explaining the method of manufacturing a semiconductor device according to the first example of the invention.

FIG. 3B shows the enlarged region 101a of the substrate 101A illustrated in FIG. 3A. In FIG. 3B and succeeding drawings, the region 101a is enlarged for convenience of illustration and explanation.

Figure 3C:
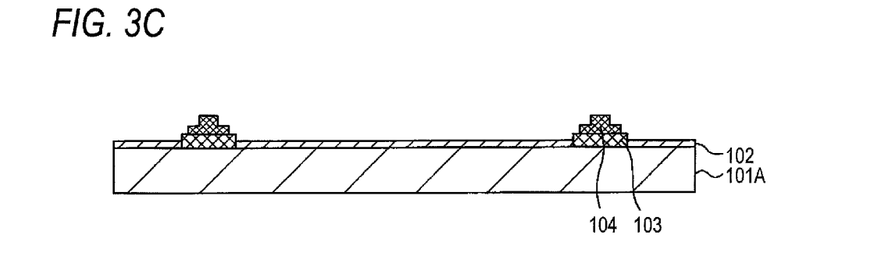
FIG. 3C is a sectional view (No. 3) for explaining the method of manufacturing a semiconductor device according to the first example of the invention.

At a step shown in FIG. 3C, the bump 104 is formed on the electrode pad 103 by using a wire bonding device, for example. The bump 104 is formed through a bonding wire formed of Au. The wire bonding device continuously bonds the bonding wire to the electrode pad 103 and cuts the bonding wire after the bonding, thereby forming a bump body 104A to be bonded to the electrode pad 103 and a protruded portion 104B which is protruded from the bump body 104A.

Figure 3D:
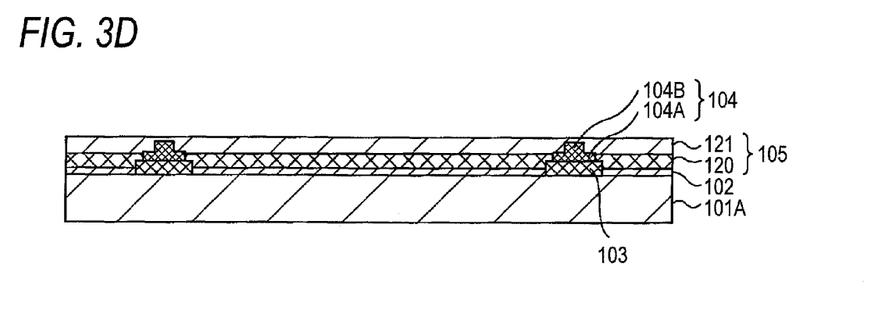
FIG. 3D is a sectional view (No. 4) for explaining the method of manufacturing a semiconductor device according to the first example of the invention.

At a step shown in FIG. 3D, next, a laminated insulating layer 105 is formed. As described above, the laminated insulating layer 105 has a structure in which the low-modulus insulating layer 120 and the high-modulus insulating layer 121 are laminated. As a method of manufacturing the laminated insulating layer 105, it is possible to propose a method of separately preparing low-modulus NCF serving as the low-modulus insulating layer 120 and high-modulus NCF serving as the high-modulus insulating layer 121, first providing the low-modulus NCF on the substrate 101A (the protecting layer 102) and disposing the high-modulus NCF thereon, thereby forming the laminated insulating layer 105 in which the low-modulus insulating layer 120 and the high-modulus insulating layer 121 are laminated.

Moreover, it is also possible to use a method of preparing laminated NCF in which low-modulus NCF and high modulus NCF are previously laminated and providing the laminated NCF on the substrate 101A (the protecting layer 102), thereby forming the laminated insulating layer 105 in a batch.

For the low-modulus insulating layer 120 and the high-modulus insulating layer 121 which are used at this time, a material having an elastic modulus which is equal to or higher than 20 MPa and is lower than 1,000 MPa is selected as the low-modulus insulating layer 120 and a material having an elastic modulus which is equal to or higher than 1,000 MPa is selected as the high-modulus insulating Layer 121.

Furthermore, the materials of the low-modulus insulating layer 120 and the high-modulus insulating layer 121 are not restricted to the NCF but it is also possible to use a buildup resin (an epoxy resin containing a filler) and a resin material referred to as ACF which can implement the characteristics.

Figure 3E:
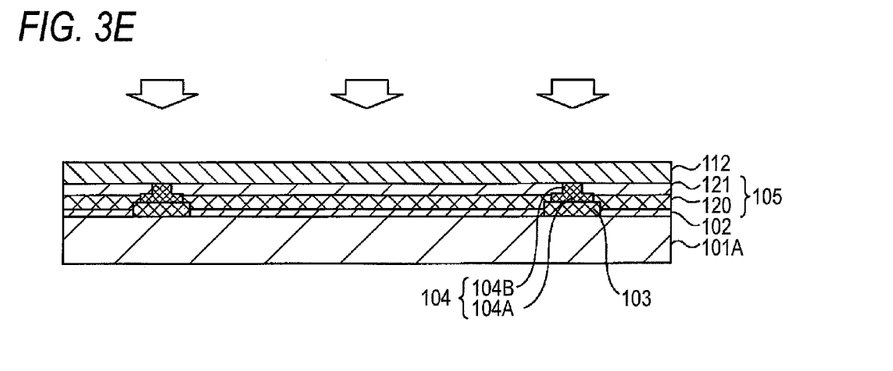
FIG. 3E is a sectional view (No. 5) for explaining the method of manufacturing a semiconductor device according to the first example of the invention.

Next, a copper foil 112 is provided on the laminated insulating layer 105 and a pressure bonding treatment is carried out as shown in FIG. 3E. Consequently, the laminated insulating layer 105 is also pressed so that a part of the protruded portion 104B in the bump 104 is exposed from an upper surface of the laminated insulating layer 105 (an upper surface of the high-modulus insulating layer 121).

In this case, the NCF to be the laminated insulating layer 105 is a comparatively soft resin material. Therefore, it is possible to reliably expose the protruded portion 104B from the laminated insulating layer 105. Moreover, a thickness of the laminated insulating layer 105 is also selected in such a manner that the protruded portion 104B is reliably protruded from the upper surface of the laminated insulating layer 105 in the pressure bonding treatment. By the pressure bonding treatment, furthermore, the protruded portion 104B of the bump 104 is pressed by the copper foil 112 and a height of a tip portion thereof is made uniform (leveling).

It is also possible to employ a method of creating a resin film having a single side coated with a copper foil in which a Cu foil is provided on a single side of a resin film having such a structure that the low-modulus insulating layer 120 and the high-modulus insulating layer 121 are laminated and providing, on the semiconductor chip 101, the resin film having a single side coated with a copper foil at the step in FIG. 3D, which is not employed in the example.

Figure 3F:
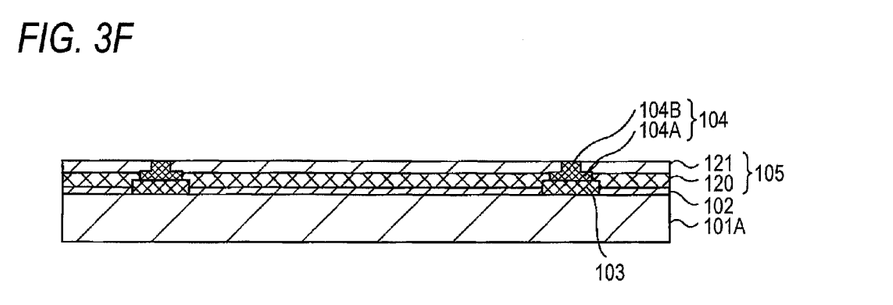
FIG. 3F is a sectional view (No. 6) for explaining the method of manufacturing a semiconductor device according to the first example of the invention.

When the pressure bonding treatment is ended, for example, the copper foil 112 is removed by using an etching process, for example. FIG. 3F shows a state in which the copper foil 112 is removed. As described above, the protruded portion 104B is exposed from the laminated insulating layer 105 and is subjected to leveling in the pressure bonding treatment. In the state in which the copper foil 112 is removed, therefore, the protruded portion 104B is exposed from the laminated insulating layer 105.

Figure 3G:
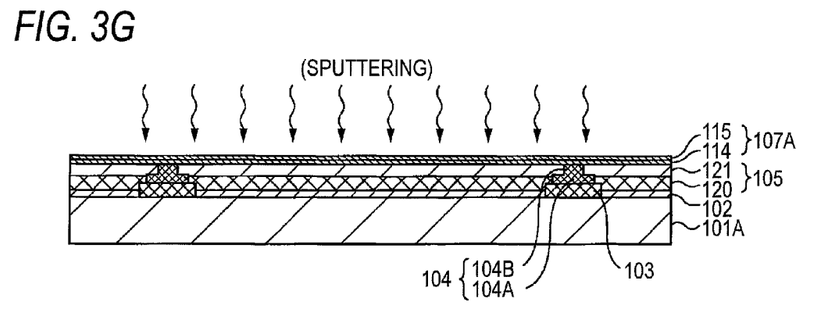
FIG. 3G is a sectional view (No. 7) for explaining the method of manufacturing a semiconductor device according to the first example of the invention.

At a step shown in FIG. 3G, next, a first conductive layer 107A is formed on the upper surfaces of the laminated insulating layer 105 and the bump body 104A. The first conductive layer 107A is formed by using a sputtering process to be a kind of depositing process, for example.

The first conductive layer 107A has a structure in which a titanium film 114 and a copper film 115 are laminated. Therefore, sputtering is first carried out by using Ti as a target to form the titanium film 114, and subsequently, the sputtering is carried out by using Cu as a target to form the copper film 115 in order to form the first conductive layer 107A on the laminated insulating layer 105. The titanium film 114 and the copper film 115 can be continuously formed by using an identical sputtering device.

Figure 3H:
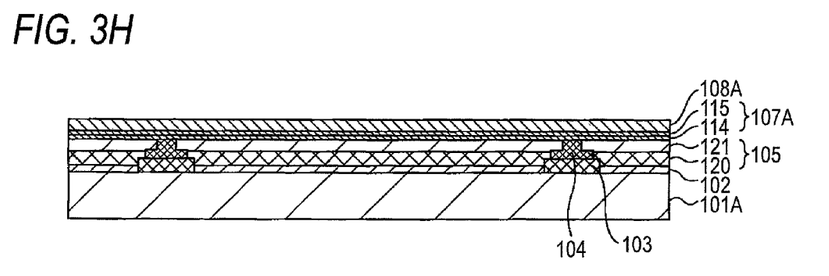
FIG. 3H is a sectional view (No. 8) for explaining the method of manufacturing a semiconductor device according to the first example of the invention.

A thickness of the titanium film 114 is set to be 0.1 µm and a thickness of the copper film 115 is set to be 1.0 µm, for example (for convenience of illustration in FIGS. 3G and 3H, the titanium film 114 and the copper film 115 are exaggeratedly drawn to be thicker than the other layers). Although the first conductive layer 107A has such a structure that the titanium film 114 and the copper film 115 are laminated in the example, moreover, it is also possible to use a chromium film (a thickness of 0.035 µm, for example) in place of the titanium film 114. Furthermore, it is also possible to constitute the first conductive layer 107A by only the copper film 115 without providing the titanium film 114 and the chromium film.

Figure 3I:
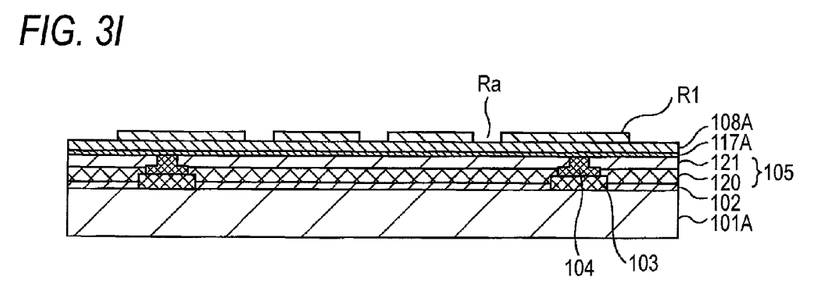
FIG. 3I is a sectional view (No. 9) for explaining the method of manufacturing a semiconductor device according to the first example of the invention.
Figure 3J:
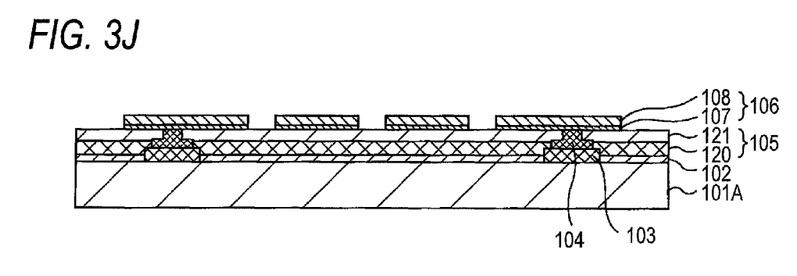
FIG. 3J is a sectional view (No. 10) for explaining the method of manufacturing a semiconductor device according to the first example of the invention.

At steps shown in FIGS. 3H to 3J, next, a conductive pattern 106 to be connected to the bump 104 is formed through electrolytic plating using the conductive layer 107A as a feeding layer (a seed layer). A method of forming the conductive pattern 106 includes so-called subtractive and semiadditive processes. In the example, description will be given to an example in which the subtractive process is used.

At the step shown in FIG. 3H, first of all, a conductive layer 108A formed of Cu, for example, is laminated on the conductive layer 107A through the electrolytic plating using the conductive layer 107A (the titanium film 114 and the copper film 115) as the feeding layer. At the step shown in FIG. 3I, next, a mask pattern R1 having an opening portion Ra is formed on the conductive layer 108A. The mask pattern R1 can be formed by forming a resist layer through an application or sticking of a film and patterning the resist layer using a photolithographic process.

At the step shown in FIG. 3J, then, the conductive layers 107A and 108A are subjected to pattern etching using the mask pattern R1 as a mask. Consequently, a first conductive layer 107 and a second conductive layer 108 are laminated, and a conductive pattern 106 connected to the bump 104 is formed.

For example, the first conductive pattern 107 is formed to have a thickness of approximately 1 to 2 μm and the second conductive pattern 108 is formed to have a thickness of approximately 10 to 30 μm, and the numeric values are only illustrative and the invention is not restricted to the numeric values.

In order to form the conductive pattern 106, it is easy to use the electrolytic plating method by setting the conductive layer 107A to be the feeding layer. In the case in which the feeding layer (seed layer) is formed through a nonelectrolytic plating method, for example, it is necessary to carry out a treatment for roughening a surface of an insulating layer (a so-called desmear treatment). Thus, a treatment for forming a plated layer is complicated.

On the other hand, in the method according to the example, the desmear treatment is not required. Consequently, it is possible to easily form the feeding layer (the conductive layer 107A) by a simple method. According to the method, therefore, a method of manufacturing a semiconductor device is simplified so that a manufacturing cost is reduced.

Figure 3K:
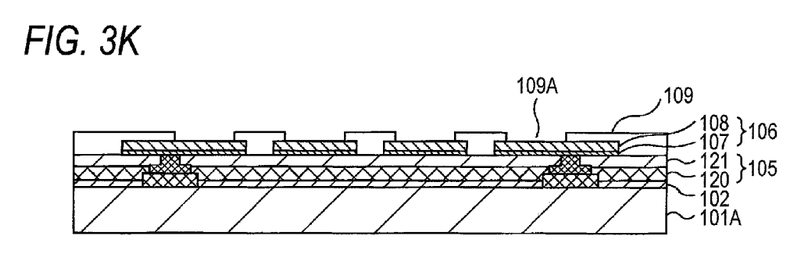
FIG. 3K is a sectional view (No. 11) for explaining the method of manufacturing a semiconductor device according to the first example of the invention.

At a step shown in FIG. 3K, thereafter, a roughening treatment is carried out over a surface of the conductive pattern 106 (Cu) if necessary, and a solder resist layer (an insulating layer) 109 having an opening portion 109A is then formed on the laminated insulating layer 105. A part of the conductive pattern 106 is exposed from the opening portion 109A.

Figure 3L:
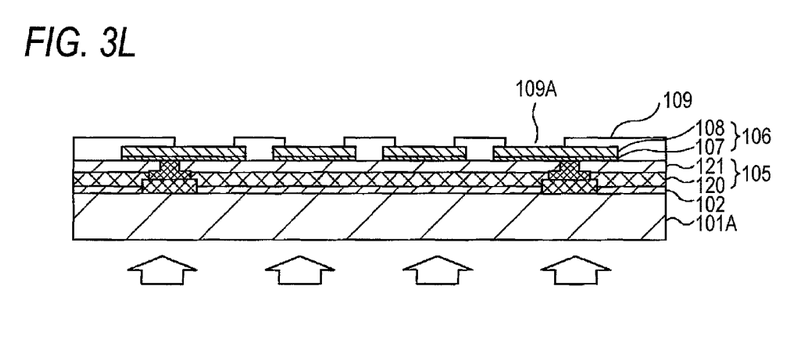
FIG. 3L is a sectional view (No. 12) for explaining the method of manufacturing a semiconductor device according to the first example of the invention.

At a step shown in FIG. 3L, subsequently, back grinding is carried out over the substrate 101A to cause the substrate 101A to have a certain thickness. In this case, in the example, the low-modulus insulating layer 120 having a low elastic modulus is provided in a position of the laminated insulating layer 105 which is close to the substrate 101A. Even if the substrate 101A is thinned so that a mechanical strength is reduced, accordingly, it is possible to prevent a warpage from being generated on the substrate 101A through the low-modulus insulating layer 120. Even if the semiconductor device 100A is thinned, accordingly, it is possible to effectively prevent the warpage from being generated.

Figure 3M:
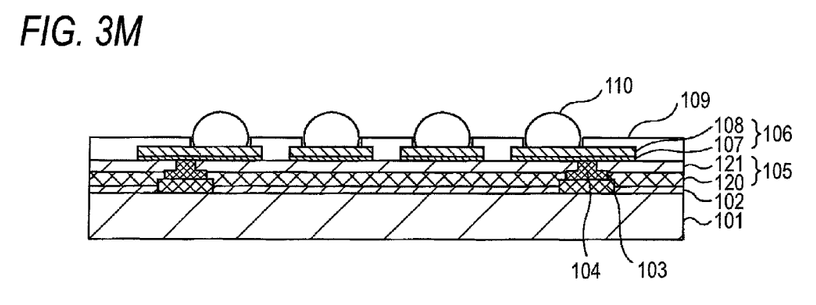
FIG. 3M is a sectional view (No. 13) for explaining the method of manufacturing a semiconductor device according to the first example of the invention.

At a step shown in FIG. 3M, subsequently, a solder bump 110 is formed on the conductive pattern 106 exposed from the opening portion 109A if necessary. Furthermore, the substrate 101A is subjected to dicing to divide the semiconductor chip into pieces. Consequently, it is possible to manufacture the semiconductor device 100A shown in FIG. 1A.

While the conductive pattern 106 is formed by the subtractive process in the manufacturing method, it may be formed by using the semiadditive process. In this case, for example, it is preferable to execute the steps shown in FIGS. 3A to 3G in the manufacturing method and to then carry out steps which will be described below in place of the steps shown in FIGS. 3H to 3J.

Figure 4:
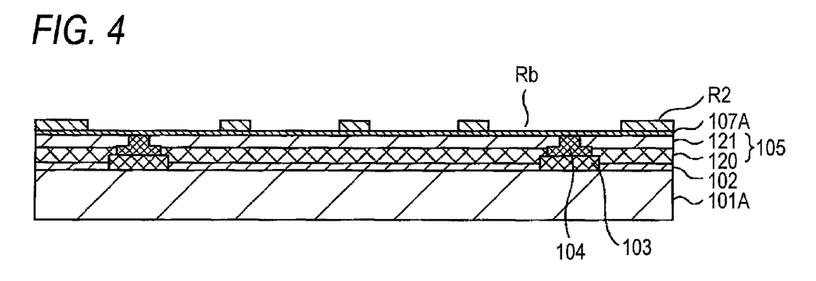
FIG. 4 is a sectional view for explaining a variant of the method of manufacturing a semiconductor device according to the first example of the invention.

More specifically, as shown in FIG. 4, a mask pattern R2 having an opening portion Rb is formed on a conductive layer 107A. The mask pattern R2 can be formed by forming a resist layer through an application or sticking of a film and patterning the resist layer using a photolithographic process.

Next, electrolytic plating using the conductive layer 107A as a feeding layer (a seed layer) is executed to form a second conductive pattern on the conductive layer 107A exposed from the opening portion Rb. Then, the mask pattern R2 is peeled, and furthermore, the excessive feeding layer 107A exposed by peeling the mask pattern R2 is removed by etching. Consequently, it is possible to form the conductive pattern 106 shown in FIG. 3J.

Figure 5A:
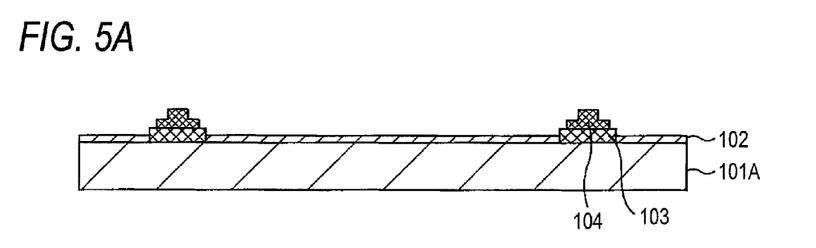
FIG. 5A is a sectional view (No. 1) for explaining a method of manufacturing a semiconductor device according to a second example of the invention.

Next, description will be given to a method of manufacturing a semiconductor device according to a second example. FIGS. 5A to 5F show the method of manufacturing a semiconductor device according to the second example. In FIGS. 5A to 5F, corresponding structures to those shown in FIG. 3A to 3M have the same reference numerals and description thereof will be omitted. FIG. 5A shows an equivalent state to the state shown in FIG. 3 described above, and a state in which a bump 104 is formed on an electrode pad 103 provided on a substrate 101A.

Figure 5B:
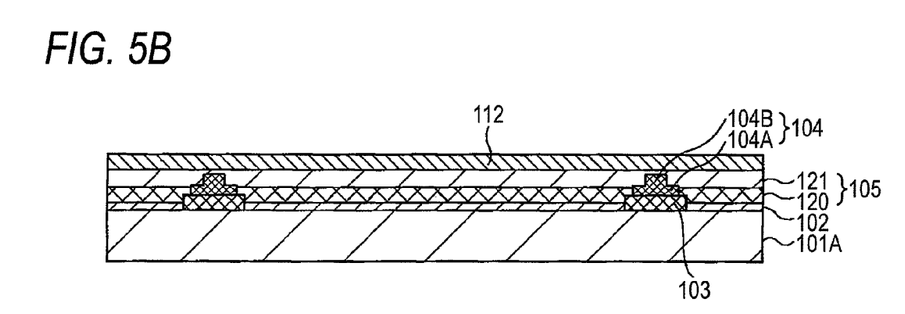
FIG. 5B is a sectional view (No. 2) for explaining the method of manufacturing a semiconductor device according to the second example of the invention.

At a step shown in FIG. 5B, next, a laminated insulating layer 105 is formed. Also in the example, the laminated insulating layer 105 has a structure in which a low-modulus insulating layer 120 and a high-modulus insulating layer 121 are laminated.

In the same manner as the manufacturing method according to the first example, moreover, in a method of manufacturing the laminated insulating layer 105, it is also possible to first provide low-modulus NCF on the substrate 101A and to dispose high-modulus NCF thereon or to prepare laminated NCF in which the low-modulus NCF and the high-modulus NCF are previously laminated and to provide the laminated NCF on the substrate 101A, thereby forming the laminated insulating layer 105 in a batch. Since materials of the low-modulus insulating layer 120 and the high-modulus insulating layer 121 which are used at this time are the same as those in the first example, description thereof will be omitted.

Figure 5C:
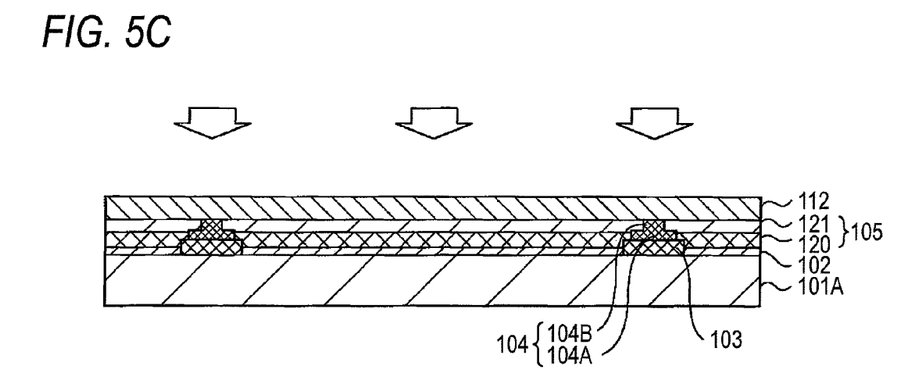
FIG. 5C is a sectional view (No. 3) for explaining the method of manufacturing a semiconductor device according to the second example of the invention.
Figure 5D:
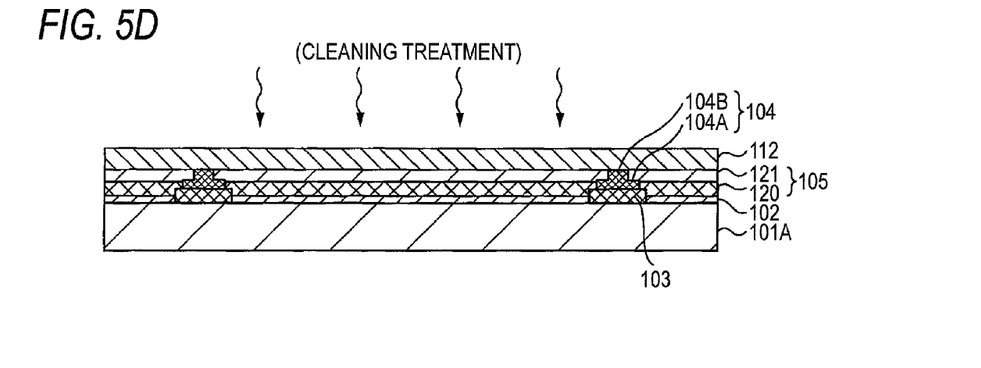
FIG. 5D is a sectional view (No. 4) for explaining the method of manufacturing a semiconductor device according to the second example of the invention.

Next, a copper foil 112 is provided on the laminated insulating layer 105 and a pressure bonding treatment is carried out as shown in FIG. 5C. In this case, a thickness of the copper foil 112 is set to be equal to or slightly greater than a thickness of a copper film to be used as a conductive pattern 106 in the example.

By the pressure bonding treatment shown in FIG. 5C, the laminated insulating layer 105 is pressed and a part of a protruded portion 104B in the bump 104 is exposed from an upper surface of the laminated insulating layer 105 (an upper surface of the high-modulus insulating layer 121). Moreover, the copper foil 112 is present on the laminated insulating layer 105. Therefore, the protruded portion 104B of the bump 104 is pressure bonded to the copper foil 112 and is electrically connected thereto. Furthermore, the copper foil 112 is pressure bonded to an upper surface of the high-modulus insulating layer 121 to be a resin. For this reason, the copper foil 112 is bonded to the upper surface of the laminated insulating layer 105 (the high-modulus insulating layer 121) by a bonding force of the high-modulus insulating layer 121.

When the copper foil 112 and the bump 104 are electrically connected to each other and the copper foil 112 and the laminated insulating layer 105 are bonded (adhered) to each other as described above, a cleaning treatment is carried out over a surface of the copper foil 112. The cleaning treatment is executed by using alkali cleaning and acid cleaning, for example.

Figure 5E:
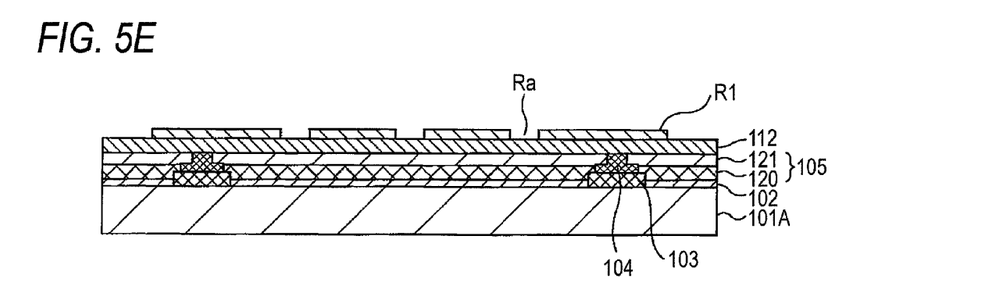
FIG. 5E is a sectional view (No. 5) for explaining the method of manufacturing a semiconductor device according to the second example of the invention.

When the cleaning treatment is ended, the copper foil 112 is processed by using a subtractive process to form the conductive pattern 106. In order to form the conductive pattern 106, first of all, a mask pattern R1 having an opening portion Ra is formed on the copper foil 112 as shown in FIG. 5E. The mask pattern R1 can be formed by forming a resist layer through an application or sticking of a film and patterning the resist layer using a photolithographic process.

Figure 5F:
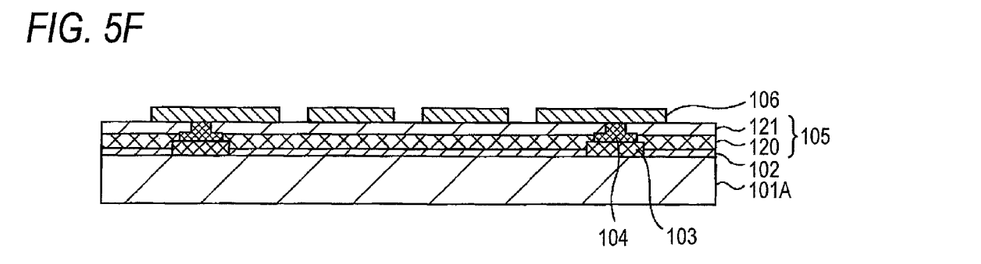
FIG. 5F is a sectional view (No. 6) for explaining the method of manufacturing a semiconductor device according to the second example of the invention.

At a step shown in FIG. 5F, next, the copper foil 112 is subjected to pattern etching using the mask pattern R1 as a mask so that the conductive pattern 106 connected to the bump 104 is formed.

While the invention is described above based on the preferred examples, the invention is not restricted to the specific examples but various modifications and changes can be made without departing from the gist described in the claims.

More specifically, it is also possible to use a glass substrate or a multilayer wiring board for the substrate 101A in place of the semiconductor substrate. Accordingly, it is possible to carry out an application to various electronic devices using the substrates.

What is claimed is:

1. An electronic device comprising:
   a substrate body having an electrode pad formed thereon;
   a bump formed on the electrode pad;
   a division insulating layer formed on the substrate body and constituted by a first insulating layer and a second insulating layer having a higher elastic modulus than an elastic modulus of the first insulating layer; and
   a conductive pattern formed on the division insulating layer and connected to the bump,
   wherein, in the division insulating layer, the second insulating layer is formed into a cylindrical shape surrounding the bump, and the first insulating layer is formed in a portion other than a portion where the second insulating layer is formed.

2. The electronic device according to claim 1, wherein
   the first insulating layer has an elastic modulus which is equal to or higher than 20 MPa and is lower than 1,000 MPa, and
   the second insulating layer has an elastic modulus which is equal to or higher than 1,000 MPa.

3. The electronic device according to claim 1, wherein the substrate body is a semiconductor chip.

* * * * *